United States Patent
Yang et al.

(10) Patent No.: US 12,230,578 B2
(45) Date of Patent: Feb. 18, 2025

(54) SEMICONDUCTOR CHIPLET DEVICE

(71) Applicants: GLOBAL UNICHIP CORPORATION, Hsinchu (TW); TAIWAN SEMICONDUCTOR MANUFACTURING COMPANY, LTD., Hsinchu (TW)

(72) Inventors: Sheng-Fan Yang, Hsinchu (TW); Chih-Chiang Hung, Hsinchu (TW); Chen Lee, Hsinchu (TW); Yuan-Hung Lin, Hsinchu (TW)

(73) Assignees: GLOBAL UNICHIP CORPORATION, Hsinchu (TW); TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 427 days.

(21) Appl. No.: 17/654,240

(22) Filed: Mar. 10, 2022

(65) Prior Publication Data
US 2023/0144129 A1    May 11, 2023

(30) Foreign Application Priority Data
Nov. 10, 2021    (TW) .................. 110141887

(51) Int. Cl.
| H01L 23/60 | (2006.01) |
| H01L 23/00 | (2006.01) |
| H01L 23/498 | (2006.01) |
| H01L 23/538 | (2006.01) |
| H01L 23/66 | (2006.01) |
| H01L 25/16 | (2023.01) |

(52) U.S. Cl.
CPC .... H01L 23/5386 (2013.01); H01L 23/49816 (2013.01); H01L 23/49833 (2013.01); H01L 23/49838 (2013.01); H01L 23/5385 (2013.01); H01L 24/16 (2013.01); H01L 25/162 (2013.01); H01L 2224/16225 (2013.01)

(58) Field of Classification Search
CPC .......... H01L 25/16; H01L 23/60; H01L 23/66
See application file for complete search history.

(56) References Cited

U.S. PATENT DOCUMENTS

| 8,742,838 B2 * | 6/2014 | Takeuchi | H01L 25/18 327/564 |
| 9,129,935 B1 * | 9/2015 | Chandrasekar | H01L 23/50 |

(Continued)

FOREIGN PATENT DOCUMENTS

| JP | 2010283130 A | * 12/2010 |
| TW | 201606973 A | 2/2016 |

*Primary Examiner* — Michele Fan
(74) *Attorney, Agent, or Firm* — CKC & Partners Co., LLC

(57) ABSTRACT

A semiconductor chiplet device includes a package substrate, an interposer layer, a first die and a second die. The first die includes a first interface, and the second die includes a second interface. A first side of the interposer layer is configured to arrange the first die and the second die. The first die and the second die perform a data transmission through the first interface, the interposer layer and the second interface. The package substrate is arranged on a second side of the interposer layer, and includes a decoupling capacitor. The decoupling capacitor is arranged between the first interface and the second interface, or arranged in a vertical projection area of the first interface and the second interface on the package substrate.

13 Claims, 3 Drawing Sheets

(56) References Cited

U.S. PATENT DOCUMENTS

2006/0087029 A1\* 4/2006 Imanaka ........... H01L 23/49822
  257/723
2016/0240527 A1\* 8/2016 Ramachandran ... H01L 27/0688
2018/0174943 A1\* 6/2018 Kinsley .................. H01L 25/50

\* cited by examiner

SEMICONDUCTOR CHIPLET DEVICE

CROSS-REFERENCE TO RELATED APPLICATION

This application claims priority to Taiwan Application Serial Number 110141887, filed Nov. 10, 2021, which is herein incorporated by reference in its entirety.

BACKGROUND

Technical Field

The present disclosure relates to a semiconductor chiplet device, especially a structure in which multiple dies are connected through an interposer layer.

Description of Related Art

With the development of High Performance Computing (HPC) and Artificial Intelligence (AI) technologies, the requirements for 3D chips and chiplet technologies is increasing. "Die-to-Die" is one of the important technologies for semiconductor chip packaging, which can package System On Chip with multiple small modules to form a multi-chip module.

SUMMARY

One aspect of the present disclosure is a semiconductor chiplet device, comprising a first die, a second die, an interposer layer and a package substrate. The first die comprises a first interface. The second die comprises a second interface. A first side of the interposer layer is configured to set the first die and the second die. The first die and the second die are configured to perform a data transmission through the first interface, the interposer layer and the second interface. The package substrate is arranged on a second side of the interposer layer, and comprises at least one decoupling capacitor. The decoupling capacitor is arranged between the first interface and the second interface, or is arranged in a vertical projection area of the first interface and the second interface on the package substrate.

Another aspect of the present disclosure is a semiconductor chiplet device, comprising a first die, a second die, an interposer layer and a package substrate. The first die comprises a first interface. The second die comprises a second interface. A first side of the interposer layer is configured to set the first die and the second die. The first die and the second die are configured to perform a data transmission through the first interface, the interposer layer and the second interface. The package substrate is arranged on a second side of the interposer layer. The interposer layer comprises at least one decoupling capacitor, the decoupling capacitor is arranged between the first interface and the second interface, or is arranged in a vertical projection area of the first interface and the second interface on the interposer layer.

It is to be understood that both the foregoing general description and the following detailed description are by examples, and are intended to provide further explanation of the disclosure as claimed.

BRIEF DESCRIPTION OF THE DRAWINGS

The present disclosure can be more fully understood by reading the following detailed description of the embodiment, with reference made to the accompanying drawings as follows.

DETAILED DESCRIPTION

For the embodiment below is described in detail with the accompanying drawings, embodiments are not provided to limit the scope of the present disclosure. Moreover, the operation of the described structure is not for limiting the order of implementation. Any device with equivalent functions that is produced from a structure formed by a recombination of elements is all covered by the scope of the present disclosure. Drawings are for the purpose of illustration only, and not plotted in accordance with the original size.

It will be understood that when an element is referred to as being "connected to" or "coupled to", it can be directly connected or coupled to the other element or intervening elements may be present. In contrast, when an element to another element is referred to as being "directly connected" or "directly coupled," there are no intervening elements present. As used herein, the term "and/or" includes an associated listed items or any and all combinations of more.

Figure 1:
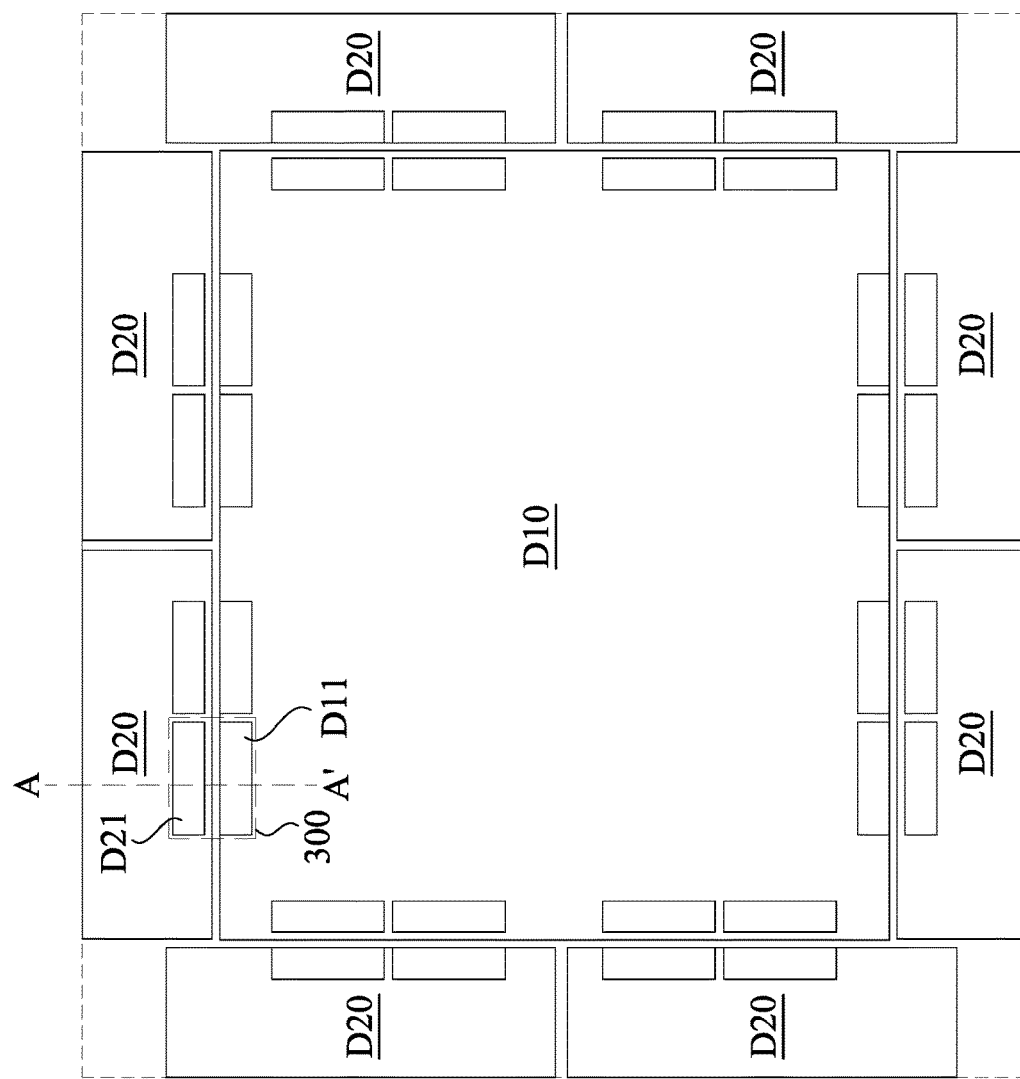
FIG. 1 is a schematic diagram of a semiconductor chiplet device in some embodiments of the present disclosure.

FIG. 1 is a schematic diagram of a semiconductor chiplet device in some embodiments of the present disclosure. The semiconductor chiplet device 100 includes a first die D10 and at least one second die D20. In one embodiment, the first die D10 may be a main Die or a System on a Chip. The second die D20 may be a chiplet, or another slave die in the dual-main chip structure. The first die D10 includes a first interface D11, and the second die D20 includes a second interface D21. The first interface D11 and the second interface D21 is configured to perform a data transmission between the first die D10 and the second die D20, to form a package interconnection transmission network between semiconductor chips.

The above the first interface D11 and second interface D21 may be implemented by a I/O interface circuit in the die (Transmitter/Receiver interface, Transmitter/Receiver interface phy). As shown in FIG. 1, each die has multiple connection interfaces, but in other embodiments, the die can also be connected to other dies through only one connection interface. The present disclosure provides a decoupling area 300 between the two interfaces D11 and D21, or in the vertical projection area of the two interfaces D11 and D21. By the decoupling capacitor of the decoupling area 300, the power integrity of the die and the quality of the transmission signal are improved.

Figure 2:
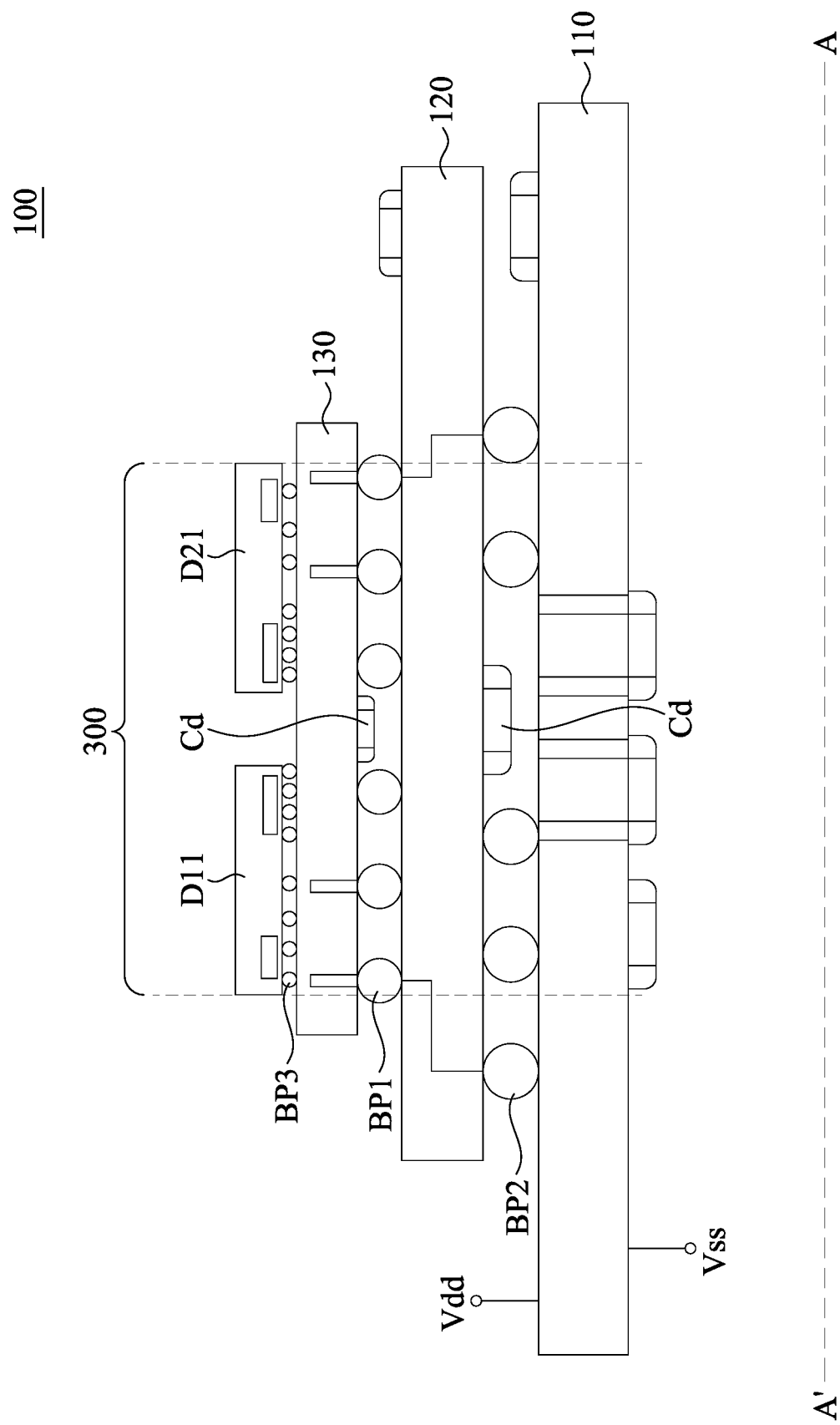
FIG. 2 is a partial structure schematic diagram of a semiconductor chiplet device in some embodiments of the present disclosure.

FIG. 2 is a partial structure schematic diagram of a semiconductor chiplet device 100 in some embodiments of the present disclosure, which corresponds to a section line A-A' of the semiconductor chiplet device 100 in FIG. 1. For clarity, FIG. 2 omits the parts of the first die D10 except the first interface D11, and omits the parts of the second die D20 except the second interface D2.

As shown in FIG. 2, the semiconductor chiplet device 100 is arranged on the circuit board 110, include a package substrate 120, an interposer layer 130 a first die D10 and a second die D20. The circuit board 110 is electrically connected to a first power node Vdd and a second power node Vss (e.g., ground). The first power node Vdd is configured to provide a driving voltage to the semiconductor chiplet device 100, so as to drive electronic components in the first die D10 and the second die D20. In particular, the first power node Vdd and the second power node Vss is configured to refer to nodes connected to a specific potential.

In one embodiment, the package substrate 120 through multiple bumps BP1, BP2 connected to the circuit board 110 by thin film process, electroless plating process technology, electroplating or printing technology, so as to electrically connect to the first power node Vdd and the second power node Vss through the circuit board 110.

The first side (the upper side as shown in FIG. 2) of the interposer layer 130 is configured to set the first die D10 and the second die D20. The second side (the bottom side as shown in FIG. 2) of the interposer layer 130 is configured to set the package substrate 120, and is electrically connected to the package substrate 120. The interposer layer 130 can also be connected to the package substrate 120, the first die D10 and the second die D20 through multiple bumps BP3.

The first die D10 and the second die D20 is electrically connected to the first power node Vdd through the interposer layer 130, the package substrate 120 and the circuit board 110, so as to receive the driving voltage.

Specifically, the material of the interposer layer 130 can be a silicon interposer, which is provided with multiple layers of wires. The wires are configured to connect the electronic signals between the dies, and can be connected to external bumps by a through silicon vias (TSV) and a wire carrier, so that the dies are tightly connected to the package substrate.

The semiconductor chiplet device 100 further includes at least one decoupling capacitor Cd. The decoupling capacitor Cd is arranged on the interposer layer 130 or the package substrate 120, and the position of the decoupling capacitor Cd corresponds to the setting positions of the first interface D11 and the second interface D21. The first interface D11 and the second interface D21 are electrically connected to the second power node Vss through the decoupling capacitor Cd, so as to form a discharge path configured to eliminate noise (i.e., the first die D1 and the second die D2 form at least one discharge path with the decoupling capacitor Cd). As shown in FIG. 2, the positions of the decoupling capacitor Cd corresponds to a position between vertical projection areas of the first interface D11 and the second interface D21. In some other embodiments, the positions of the decoupling capacitor Cd can also be located at the vertical projection area of the first interface D11, the second interface D21, or be located between the first die D10 the second die D20. "The vertical projection area" refers to the area where the first interface D11 and the second interface D21 are projected onto the package substrate 120 or the interposer layer 130.

Accordingly, during the semiconductor chiplet device 100 is operating, if noise is generated on the first die D10 or the second die D20, the noise will be conducted to the second power node Vss through the decoupling capacitor Cd without affecting other dies or other components of the circuit board 110. By using the decoupling capacitor Cd to eliminate noise, the power supply voltage can be prevented from being interfered and reduce beyond the normal range, and the power integrity optimization of the semiconductor chiplet device 100 can be ensured.

In addition, since the decoupling capacitor Cd is located between the first interface D11 and the second interface D21, or is located in the projection area of the first interface D11 and the second interface D21, instead of being located at a position farther away from the same horizontal plane as the first die D1/the second die D21 (i.e., the distance is shorter), the effect of the decoupling capacitor Cd can be ensured.

In one embodiment, the decoupling capacitor Cd is arranged on the package substrate 120. As shown in FIG. 2, the decoupling capacitor Cd is arranged between the package substrate 120 and the circuit board 110 (i.e., a side of the package substrate 120 facing the circuit board 110). However, the present disclosure is not limited to this, the decoupling capacitor Cd can also be arranged between the package substrate 120 and the interposer layer 130 (e.g., a side of the package substrate 120 facing the interposer layer 130).

As shown in FIG. 2, in some other embodiments, the decoupling capacitor Cd is arranged on the interposer layer 130, and is arranged between the interposer layer 130 and the package substrate 120. In other words, the decoupling capacitor Cd is arranged on a side of the interposer layer 130 facing the package substrate 120), such as setting between the bump BP1 and the bump BP2. In some other embodiments, the decoupling capacitor Cd can also be arranged on a first side of the interposer layer 130, which is located between the first die D10 and the second die D20.

In some embodiments, the number of the decoupling capacitor Cd can be adjusted. For example, the semiconductor chiplet device 100 can provide one decoupling capacitor Cd under the space between the first interface D11 and the second interface D21, or the semiconductor chiplet device 100 can also provide a decoupling capacitor Cd under the first interface D11 and the second interface D21, respectively.

Figure 3:
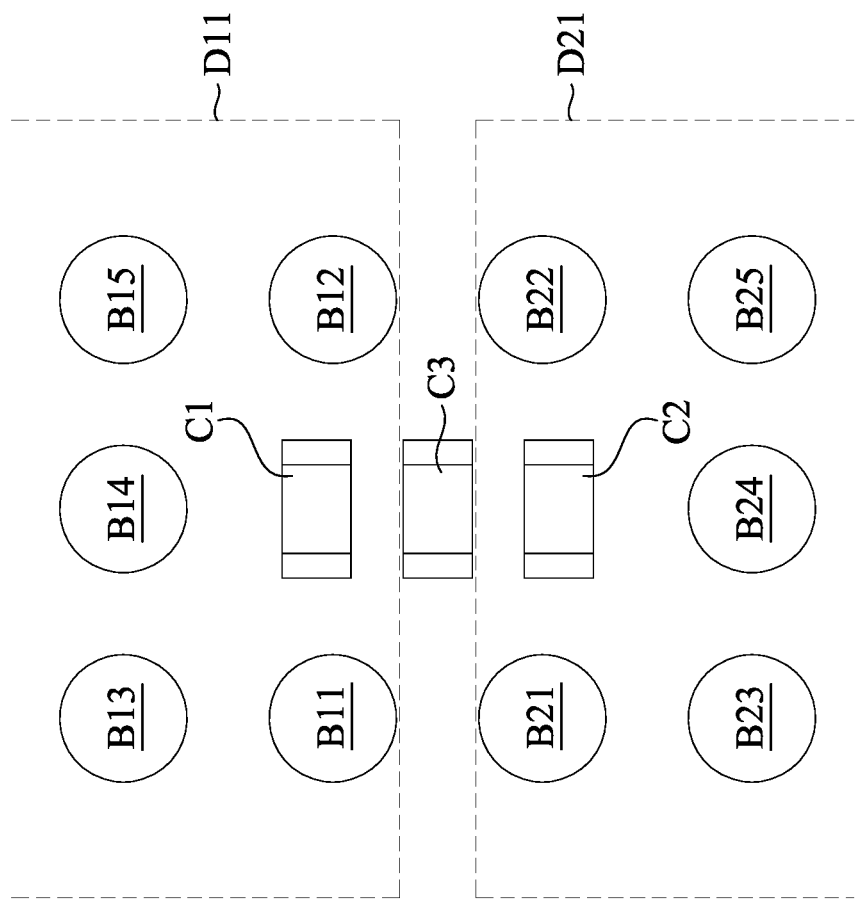
FIG. 3 is a schematic diagram of the vertical projection area and the decoupling capacitor in some embodiments of the present disclosure.

FIG. 3 is a schematic diagram of the vertical projection areas of die D1, D2 on the package substrate 120 or the interposer layer 130 and the decoupling capacitor in some embodiments of the present disclosure, as mentioned above, in the present disclosure, the decoupling capacitor Cd of the decoupling area 300 is arranged adjacent to the vertical projection areas of the two interfaces D11 and D21 to solve the noise problem of the die. FIG. 3 shows the locations of multiple nodes B11-B15, B21-B25. In one embodiment, the nodes B11-B15, B21-B25 represent bumps BP1 between the package substrate 120 and the interposer layer 130 in FIG. 2, or represent bumps BP2 between the package substrate 120 and the circuit board 110 in FIG. 2.

Nodes B11-B15 is electrically connected to the first interface D11, and nodes B21-B25 is electrically connected to the second interface D21. For example, the nodes B11, B12 are used as multiple first power nodes of the first interface D11 of the first die D10, and the node B13 is used as the first ground node of the first interface D11 of the first die D10. Similarly, the nodes B21 and B22 are used as multiple second power nodes of the second interface D21 of the second die D20, and the nodes B23 is used as the second ground node of the second interface D21 of the second die D20. The nodes B11, B12, B21, B22 are electrically connected to the first power node Vdd through the package substrate 120 and the circuit board 110. The nodes B13 and B23 are connected to the second power node Vss through the decoupling capacitor Cd.

The embodiment in FIG. 2 draws one decoupling capacitor Cd, but in some other embodiments, the semiconductor chiplet device 100 may include multiple decoupling capacitors. As shown in FIG. 3, in one embodiment, the semiconductor chiplet device 100 includes a first decoupling capacitor C1, a second decoupling capacitor C2 and a third decoupling capacitor C3 (i.e., the decoupling capacitor Cd in FIG. 2). All of the decoupling capacitors C1-C3 are electrically connected to the first power node Vdd and the second power node Vss through the interposer layer 130, the package substrate 120 and the circuit board 110. The decoupling capacitors C1-C3 are connected in parallel with each other. As shown in FIG. 3, the position of the first decoupling capacitor C1 is arranged in a first vertical projection area of the first interface D11, and the second decoupling capacitor C2 is arranged in a second vertical projection area of the second interface D21. The third decoupling capacitor C3 is arranged between the first vertical projection area and the second vertical projection area. As mentioned above, the decoupling capacitors C1-C3 can be arranged on the interposer layer 130 or the package substrate 120. "The vertical projection area" refers to the projection area of the interfaces D11, D21 on the interposer layer 130 or the package substrate 120.

In one embodiment, the first decoupling capacitor C1 is arranged between the nodes B11 and B12 connected to the first power node Vdd. The second decoupling capacitor C2 is arranged between the nodes B21 and B22, wherein the nodes B21 and B22 are connected to the first power node Vdd. The above "position" is a vertical projection position corresponding to the semiconductor chiplet device 100.

In some embodiments, the first die D1 and the second die D2 operate in different power domains. In other words, the operating voltages of the first die D1 and the second die D2 are different from each other. In addition, when the first die D1 and the second die D2 operate in different power domains, the semiconductor chiplet device 100 will generate the switching noise (simultaneously switching noise, SSN). The switching noise is generated by the first die D1 or the second die D2. The decoupling capacitor Cd may transmit the switching noise to the second power node Vss, so that the switching noise will not affect the power supply stability of the first power node Vdd.

The elements, method steps, or technical features in the foregoing embodiments may be combined with each other, and are not limited to the order of the specification description or the order of the drawings in the present disclosure.

It will be apparent to those skilled in the art that various modifications and variations can be made to the structure of the present disclosure without departing from the scope or spirit of the present disclosure. In view of the foregoing, it is intended that the present disclosure cover modifications and variations of this present disclosure provided they fall within the scope of the following claims.

What is claimed is:

1. A semiconductor chiplet device, comprising:
a first die comprising a first interface, wherein the first interface has a plurality of first power nodes;
a second die comprising a second interface, wherein the second interface has a plurality of second power nodes;
an interposer layer comprising a first side and a second side corresponding to the first side of the interposer layer, wherein the first side of the interposer layer is configured to set the first die and the second die to couple to the first die and the second die, the first die and the second die are configured to perform a data transmission through the first interface, the interposer layer and the second interface;
a package substrate arranged on the second side of the interposer layer, and comprising a first side and a second side corresponding to the first side of the package substrate, wherein the first side of the package substrate is coupled to the second side of the interposer layer through a plurality of first bumps and a plurality of second bumps, the plurality of first bumps is coupled to the plurality of first power nodes through the interposer layer, and the plurality of second bumps is coupled to the plurality of second power nodes through the interposer layer;
a plurality of third bumps arranged on the second side of the package substrate, and coupled to the plurality of first bumps through the package substrate;
a plurality of fourth bumps arranged on the second side of the package substrate, and coupled to the plurality of second bumps through the package substrate;
a first decoupling capacitor arranged on the second side of the package substrate, wherein the first decoupling capacitor is arranged between the plurality of third bumps, and is arranged in a first vertical projection area of the first interface on the package substrate; and
a second decoupling capacitor arranged on the second side of the package substrate, wherein the second decoupling capacitor is arranged between the plurality of fourth bumps, and is arranged in a second vertical projection area of the second interface on the package substrate.

2. The semiconductor chiplet device of claim 1, wherein the first die and the second die receive a driving voltage by the interposer layer and the package substrate, and are configured to form at least one discharge path with the first decoupling capacitor or the second decoupling capacitor.

3. The semiconductor chiplet device of claim 1, further comprising:
a third decoupling capacitor arranged between the first vertical projection area and the second vertical projection area.

4. The semiconductor chiplet device of claim 3, wherein the first decoupling capacitor, the second decoupling capacitor, and the third decoupling capacitor are connected in parallel with each other.

5. The semiconductor chiplet device of claim 1, wherein the first die comprises at least one first ground node, the second die comprises at least one second ground node, the plurality of first power nodes and the plurality of second power nodes receive a driving voltage by the interposer layer and the package substrate, and the at least one first ground node and the at least one second ground node are configured to form at least one discharge path with the interposer layer, the package substrate and the first decoupling capacitor or the second decoupling capacitor.

6. The semiconductor chiplet device of claim 1, wherein the first die and the second die operate in different power domains.

7. The semiconductor chiplet device of claim 6, wherein the first decoupling capacitor or the second decoupling capacitor is configured to receive a switching noise generated by the first die or the second die.

8. A semiconductor chiplet device, comprising:
a first die comprising a first interface wherein the first interface has a plurality of first power nodes;
a second die comprising a second interface, wherein the second interface has a plurality of second power nodes;
an interposer layer comprising a first side and a second side corresponding to the first side of the interposer layer, wherein the first side of the interposer layer is configured to set the first die and the second die to couple to the first die and the second die, the first die and the second die are configured to perform a data transmission through the first interface, the interposer layer and the second interface;
a package substrate arranged on the second side of the interposer layer; wherein the package substrate comprises a first side and a second side corresponding to the first side of the package substrate, wherein the first side of the package substrate is coupled to the second side of the interposer layer through a plurality of first bumps and a plurality of second bumps, the plurality of first bumps is coupled to the plurality of first power nodes through the interposer layer, and the plurality of second bumps is coupled to the plurality of second power nodes through the interposer layer;

a first decoupling capacitor arranged on the second side of the interposer layer, the first decoupling capacitor is arranged between the plurality of first bumps, and is arranged in a first vertical projection area of the first interface on the interposer layer; and a second decoupling capacitor arranged on the second side of the interposer layer, wherein the second decoupling capacitor is arranged between the plurality of second bumps, and is arranged in a second vertical projection area of the second interface on the interposer layer.

9. The semiconductor chiplet device of claim 8, further comprising:

a third decoupling capacitor arranged between the first vertical projection area and the second vertical projection area.

10. The semiconductor chiplet device of claim 9, wherein the first decoupling capacitor, the second decoupling capacitor, and the third decoupling capacitor are connected in parallel with each other.

11. The semiconductor chiplet device of claim 8, wherein the first die comprises at least one first ground node, the second die comprises at least one second ground node, the plurality of first power nodes and the plurality of second power nodes receive a driving voltage by the interposer layer and the package substrate, and the at least one first ground node and the at least one second ground node are configured to form at least one discharge path with the interposer layer and the first decoupling capacitor or the second decoupling capacitor.

12. The semiconductor chiplet device of claim 8, wherein the first die and the second die operate in different power domains.

13. The semiconductor chiplet device of claim 12, wherein the first decoupling capacitor or the second decoupling capacitor is configured to receive a switching noise generated by the first die or the second die.

* * * * *